United States Patent
König

(10) Patent No.: US 7,791,176 B2
(45) Date of Patent: Sep. 7, 2010

(54) POWER SEMICONDUCTOR COMPONENT WITH TRENCH-TYPE SECOND CONTACT REGION

(75) Inventor: Bernhard König, Fürth (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 0 days.

(21) Appl. No.: 12/317,338

(22) Filed: Dec. 22, 2008

(65) Prior Publication Data

US 2009/0179309 A1    Jul. 16, 2009

(30) Foreign Application Priority Data

Dec. 21, 2007   (DE) .................. 10 2007 062 306

(51) Int. Cl.
    *H01L 29/06* (2006.01)
(52) U.S. Cl. .............. 257/653; 257/495; 257/496; 257/E27.051; 257/E29.329
(58) Field of Classification Search ............. 257/495, 257/496, 653, E27.051, E29.329; 438/700
    See application file for complete search history.

(56) References Cited

U.S. PATENT DOCUMENTS

| | | | | |
|---|---|---|---|---|
| 6,262,439 B1* | 7/2001 | Takeuchi et al. | ............... | 257/77 |
| 6,476,458 B2* | 11/2002 | Miyajima | ............... | 257/496 |
| 6,479,957 B1* | 11/2002 | Erdman et al. | ......... | 318/400.22 |
| 6,927,455 B2* | 8/2005 | Narazaki | ............... | 257/341 |
| 7,436,022 B2* | 10/2008 | Bhalla et al. | ............... | 257/328 |
| 7,586,148 B2* | 9/2009 | Blanchard | ............... | 257/328 |
| 2004/0157384 A1* | 8/2004 | Blanchard | ............... | 438/197 |
| 2005/0212075 A1* | 9/2005 | Neidig | ............... | 257/502 |
| 2008/0150020 A1* | 6/2008 | Challa et al. | ............... | 257/331 |
| 2009/0008709 A1* | 1/2009 | Yedinak et al. | ............... | 257/331 |
| 2009/0085103 A1* | 4/2009 | Hille et al. | ............... | 257/330 |
| 2009/0102007 A1* | 4/2009 | Kocon | ............... | 257/471 |
| 2009/0315103 A1* | 12/2009 | Hsieh | ............... | 257/330 |
| 2010/0032732 A1* | 2/2010 | Booth et al. | ............... | 257/288 |

FOREIGN PATENT DOCUMENTS

DE          43 37 329          5/1995

\* cited by examiner

*Primary Examiner*—Ngan Ngo
(74) *Attorney, Agent, or Firm*—Cohen Pontani Lieberman & Pavane LLP

(57) ABSTRACT

A power semiconductor component and method for producing it. The component has a semiconductor base body with a first doping and a pn junction formed by a contact region having a second doping with a doping profile in the base body. The second contact region is arranged at a second surface of the base body and extends into the base body. The base body has a trench-type cutout with an edge area and a base area, wherein the base area is formed as a second partial area of the second surface, and wherein the second contact region extends from the base area via the edge area as far as a first partial area. Furthermore, the pn junction has a curvature adjacent to the edge area.

12 Claims, 4 Drawing Sheets

POWER SEMICONDUCTOR COMPONENT WITH TRENCH-TYPE SECOND CONTACT REGION

BACKGROUND OF THE INVENTION

1. Field of the Invention

The invention is directed to a power semiconductor component comprising at least one pn junction, preferably a power diode having a reverse voltage strength of at least 600 V, for applications in power class converters, to provide minimum switching losses.

2. Description of the Related Art

German Patent No. DE 43 37 329 C2 discloses a power semiconductor component, a power diode, having a pn junction, wherein recombination centers are produced in the semiconductor body by means of irradiation with high-energy particles. Both electrons and helium nuclei are employed for this purpose. This results in the formation of a fast power diode having a high dielectric strength and further positive properties in combination with power transistors.

What is disadvantageous such a power diode, however, is that the irradiation, for example with helium nuclei, results in the production of defects in the semiconductor body which lead to higher reverse currents as a result of charge carrier generation in the blocking state. However, this effect of the implantation can be partly compensated for in a further process step.

Other known methods of forming a power semiconductor device include the step of forming a region having a second doping having a low concentration in a semiconductor body having a first doping. The resulting pn junction runs parallel to the surface and has, at the edge region of the doping zone, a high degree of curvature of the pn junction before the latter reaches the surface. What is disadvantageous in such a known device is that it has a low dielectric strength due to the small penetration depth of the second doping. A complicated configuration of the edge region beyond the second doping is necessary in order to compensate for this disadvantage.

SUMMARY OF THE INVENTION

It is an object of the invention to provide a power semiconductor component having low switching losses in conjunction with a high dielectric strength, and a method of producing such a component.

The inventive power semiconductor component comprises a semiconductor base body having a first, preferably n-type, doping with a first contact region. To form at least one pn junction, at least one region having a second, preferably p-type, doping, which is referred to hereinafter as a second contact region, is arranged in the base body. Since the region having a second doping is preferably formed by means of diffusion, it does not have a homogeneous doping but rather has a doping profile having a decreasing concentration proceeding from the dopant introduction area.

Furthermore, it may be preferred if the power semiconductor component according to the invention has a plurality of field rings arranged in the edge region of the power semiconductor component. The field rings are likewise embodied as regions having a second doping and likewise having a doping profile and enclose the second contact region, preferably concentrically. Both the second contact region and the field rings are arranged at a second surface of the base body and extend into the volume of the base body as described. As an alternative to the configuration of the edge region with field rings, further alternatives, such as VLD variation in lateral doping, for example, are also known in accordance with the prior art.

According to the invention, the base body has a trench-type cutout delimited by an edge area and a base area in the second contact region. In this case, the base area is formed as a second partial area of the second surface of the power semiconductor component and arranged parallel to a first partial area in the region of the optional field rings. The second contact region thus extends from the second partial area via the edge area as far as the first partial area. The power semiconductor component described is a volume component in which the load current flow takes place between the two surfaces.

In the configuration of the semiconductor component according to the invention, it may be preferred if the edge area has a curvature that parallels the curvature of the pn junction. As an alternative, the edge area can be formed perpendicular to, or with a slope at an angle of at most 45° with respect to, the base area, wherein the edge area meets the base area in a region in which the pn junction runs substantially parallel to the second surface.

One embodiment of the inventive method for producing a power semiconductor component mentioned above comprises the following steps:

Masking a second surface of a semiconductor base body having a first doping, in accordance with the prior art. A first contact region is situated at the first surface lying opposite the second surface.

Producing doping profiles having a second doping proceeding from the second surface in a first partial section, which forms the first partial area of the surface, and in a second partial section, whereby both the field rings and the second contact region are produced. The two method steps are preferably performed simultaneously, whereby both doping profiles are formed identically in terms of their concentration characteristic.

Forming a trench in the region of the second partial area of the surface for producing the base area and edge area of the second contact region. For this purpose, it is preferred for the region which is not to be removed to be masked and for the trench subsequently to be formed by means of a wet and/or dry etching method. The depth extent of the trench amounts to between about 50 percent and about 90 percent of the penetration depth of the second doping, of the position of the pn junction. The lateral extent of the trench amounts to at least about ten times the depth extent.

At least partial passivation of the first partial area.

Metallizing the second contact region for forming a contact area for an electrically conductive connection. In this case, it may be preferred for metallic field plates respectively assigned to the field rings to be produced at the same time as the metallization of the second contact region in the region of the field rings.

A second embodiment of the inventive method comprises the following method steps:

Masking a surface of a semiconductor base body having a first doping, in accordance with the prior art.

Forming a trench in the region of the second partial area of the second surface of the region of the later second contact region. In this case, it is preferred for the trench to be formed by means of known wet and/or dry etching methods.

Producing a doping profile having a second doping by means of ion implantation proceeding from the second surface in a partial section that forms the second partial area.

At least partial passivation of the first partial area.

Metallizing the second contact region for forming a contact area for an electrically conductive connection.

What is common to both embodiments is that the curvature of the pn junction is made significantly smaller compared to known methods. As a result of this, the dielectric strength of the power semiconductor component is significantly increased and the configuration of the edge region, for example by means of field rings, is likewise less complex.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The inventive solution is explained in more detail on the basis of the exemplary embodiments illustrated in the attached figures.

DETAILED DESCRIPTION OF THE PRESENTLY PREFERRED EMBODIMENTS

Figure 1:
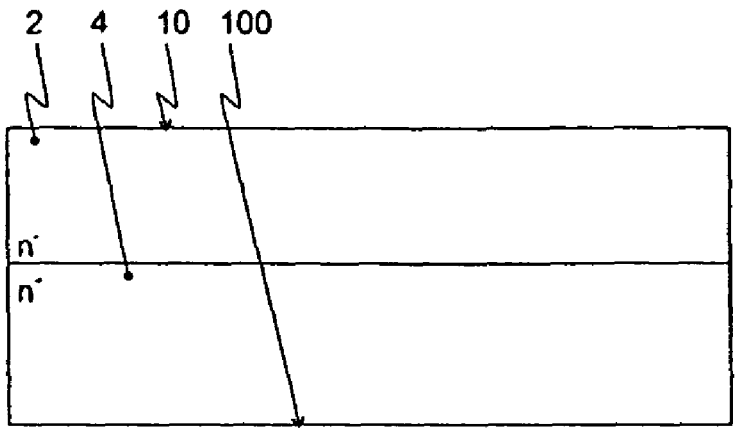
FIG. 1 depicts the base body of a power semiconductor component according to the invention.

FIG. 1 shows an excerpt—not to scale—from a base body 2, 4 of a power semiconductor component according to the invention, illustrated, by way of example, as a power diode for a reverse voltage of 1200 V. This example is also maintained in principle for the following figures. In this case, the semiconductor base body has an n-type doping having two concentrations. A weakly doped region 2 is adjacent to a surface 10 of the base body, while a heavily doped region 4 is adjacent to the surface 100. The boundary of the two dopings runs in the interior of the base body parallel to surfaces 10, 100.

Figure 2:
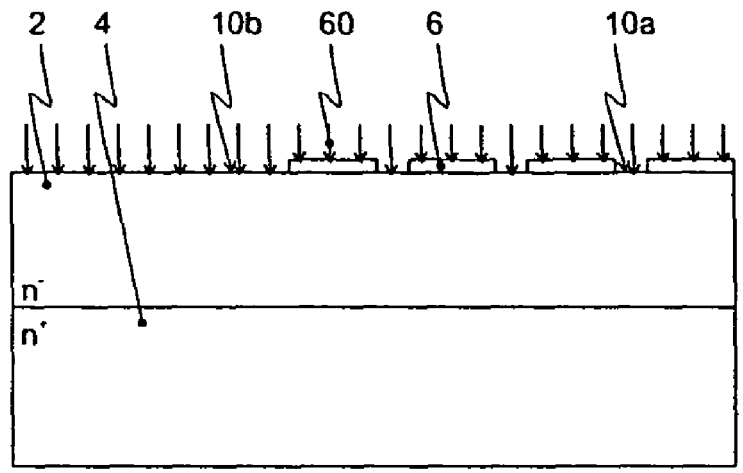
FIG. 2 depicts the partial step for forming the second doping of the first method according to the invention.

FIG. 2 shows the partial step for forming the second doping of the method according to the invention. As is known, various regions are masked 6 here in preparation for the selected doping. Field rings will be formed in the region of a first partial area 10a, and a second contact region will arise in the region of a second partial area 10b. In this case, doping by means of diffusion 60 is effected from the direction of the second surface 10 in accordance with the prior art.

Figure 3:
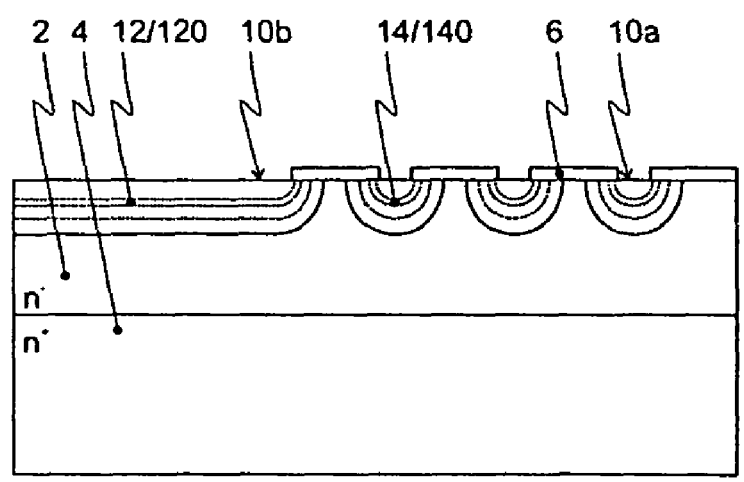
FIG. 3 depicts the partial step after forming the second doping of the first method according to the invention.

FIG. 3 shows the partial step after forming the second, here p-type, doping 12, 14 of the inventive method. The illustration furthermore shows the characteristic of the doping profile 120, 140, that is to say the decrease in the concentration of p-type dopants with the penetration depth. It can be seen that the p-type dopants not only penetrate into semiconductor base body 2, 4 perpendicular to surface 10 but also penetrate along the surface and form approximately semicircular regions given a sufficiently small opening of masking 6. This also applies analogously to the formation of the second contact region, which also extends laterally in a direction of the first field ring, wherein here as well the concentration of p-type dopants decreases with the depth.

Figure 4A:
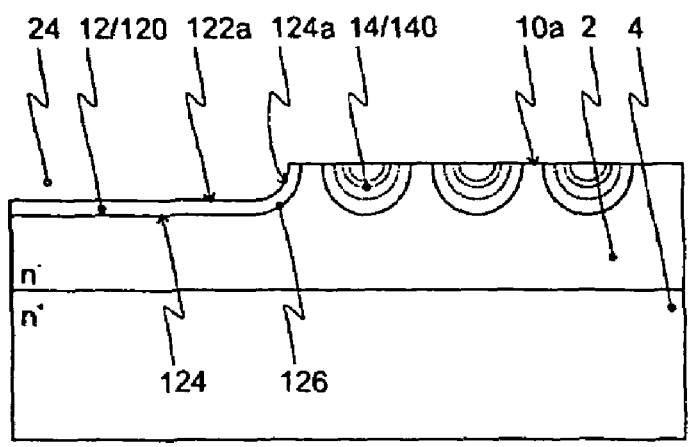
FIG. 4 depicts, in two variants, the partial step after forming the trench in the context of a first embodiment of the inventive method.

FIG. 4 shows two embodiments of the inventive method, specifically the partial step after forming the trench. FIG. 4a shows a first embodiment, wherein the etching erosion for forming the trench is effected by suitable masking and a suitable etching medium essentially along a concentration line of p-type doping 120. This gives rise to a weakly doped second contact region 12 with a base area 122a and an edge area 124a continuously adjacent thereto and ending approximately at a right angle at the first partial area 10a of the surface. The doping of second contact region 12 is thus formed flat in the volume and homogeneous with regard to the concentration at the entire surface 10b.

Figure 4B:
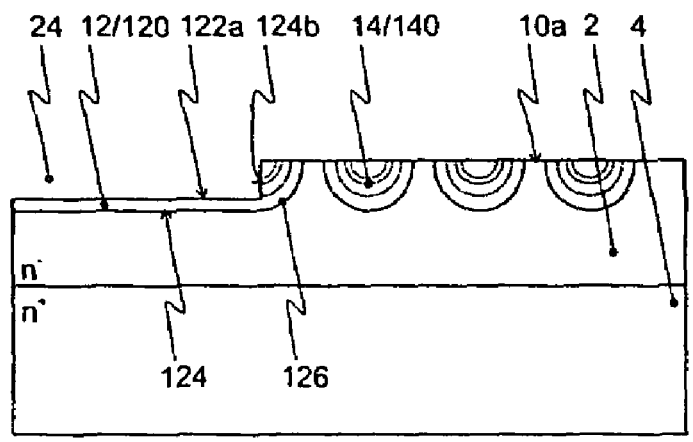

FIG. 4b shows a second embodiment of the inventive method, wherein the etching erosion is effected by suitable masking and a suitable etching medium essentially perpendicular to surface 10. In this case, consideration should be given to the fact that edge area 124b meets base area 122b at a location at which the concentration line of doping profile 120 parallels base area 122b. This ensures that after the formation of the trench, the remaining concentration in the region of the transition from base area 122b to edge area 124b is not lower than under another section of base area 122b. Consequently, doping profile 120 of edge area 124b is formed deeply in the vicinity of first partial area 10a and essentially identical to that doping profile 140 of half a doping profile of a field ring 14.

Figure 5A:
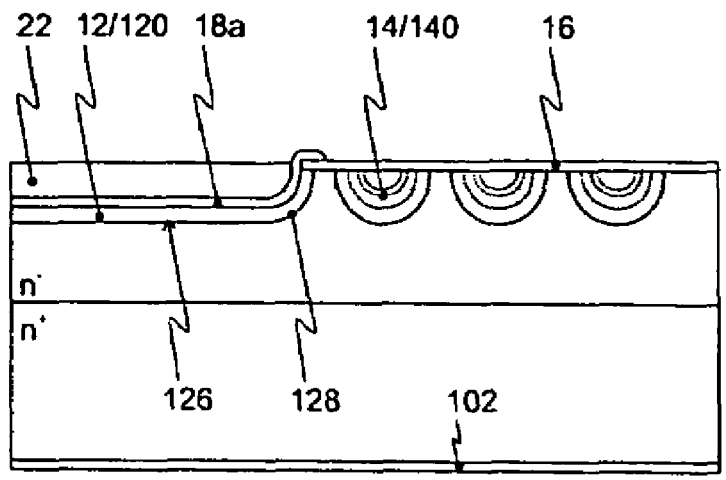
FIG. 5 depicts two embodiments of the inventive power semiconductor component.

FIG. 5 shows two embodiments of the inventive power semiconductor component. FIG. 5a shows the first embodiment formed in accordance with FIG. 4a, wherein here the first partial area 10a above field rings 14 is completely covered with a passivation layer 16. Furthermore, before the subsequent metallization 18 of second contact region 12, a region—near the surface—having a second doping having a high concentration is additionally produced in region in order to form an ohmic contact with metallization 18.

Furthermore, second contact region 12, that is to say base area 122a and edge area 124b, is provided with a contact metallization 18a, which preferably also slightly covers passivation 16 of first partial area 10a.

It may furthermore be preferred to fill the entire trench with a metal layer 22 to yield a generally plane surface of the power semiconductor component.

Figure 5B:
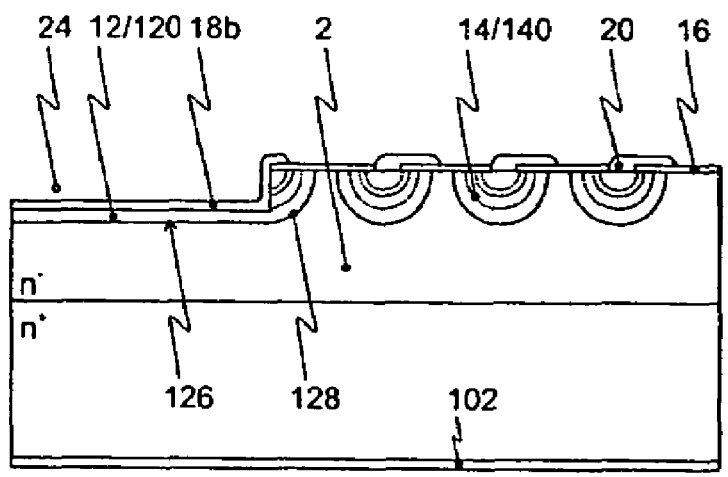

FIG. 5b shows the second embodiment formed in accordance with FIG. 4b, wherein here first partial area 10a above field rings 14 is not completely covered with a passivation layer 20. The cutouts are situated in the region of field rings 14 and permit electrically contact-connecting a field ring 14 to a respective field plate 20 assigned thereto.

Both the embodiments of FIGS. 5a and 5b illustrate on the second surface 100 a metallization 102 thereof, which serves for example for soldering connection to a substrate.

A typical order of magnitude for a power diode having a preferred base area in the range of between 10 mm$^2$ and 100 mm$^2$ and a reverse voltage of 1200 V here involves the following:

The thickness of the power diode is between about 100 μm and about 450 μm.

The pn junction 126, that is to say the penetration depth of the second, here p-type, doping 120, 140 is between about 10 μm and about 30 μm.

The depth extent of the trench is a maximum of about 90 percent and a minimum of about 50 percent of the penetration depth of the second doping. Given a penetration depth of about 20 μm, the depth of the trench is thus between about 10 μm and about 18 μm.

The region having the second doping of the second contact region 12 has a preferred concentration of from about $10^{15}$ to about $10^{16}$ cm$^{-3}$ at the surface.

The further region—near the surface—having the second doping of the contact area for the ohmic contact with respect to the metallization has a preferred concentration of from about $10^{18}$ to about $10^{20}$ cm$^{-3}$.

Figure 6:
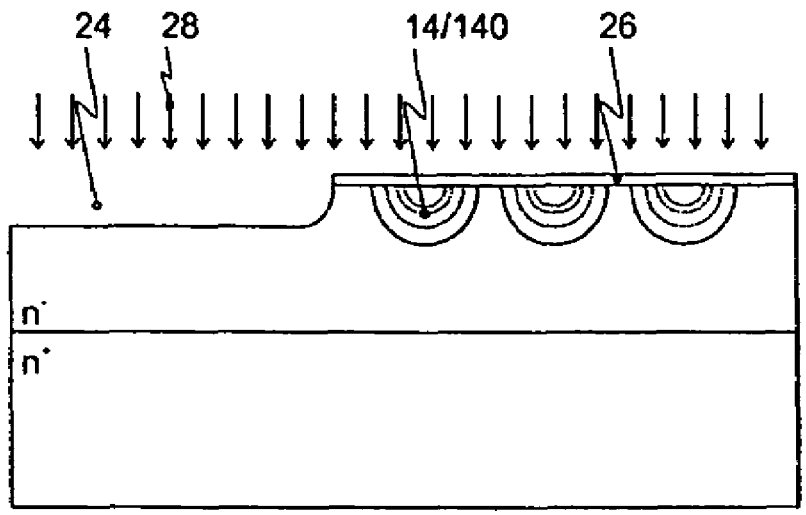
FIG. 6 depicts the partial step for forming the trench and the second doping by means of a second embodiment of the inventive method.

FIG. 6 illustrates the partial step for forming trench 24 and second contact region 12 in accordance with the second embodiment of the inventive method. On the basis of a base body 2, 4, in accordance with FIG. 1, in a first step, field rings 14 required for a higher reverse voltage are formed. Afterwards, the region 26 that does not serve for forming the second contact region 12 is masked and a trench 24 is formed proceeding from second surface 10. In a next step, ion implantation 28 is effected from the direction of second surface 10. The ion implantation is advantageously additionally followed by an annealing step for eliminating crystal defects produced during the implantation.

Figure 7:
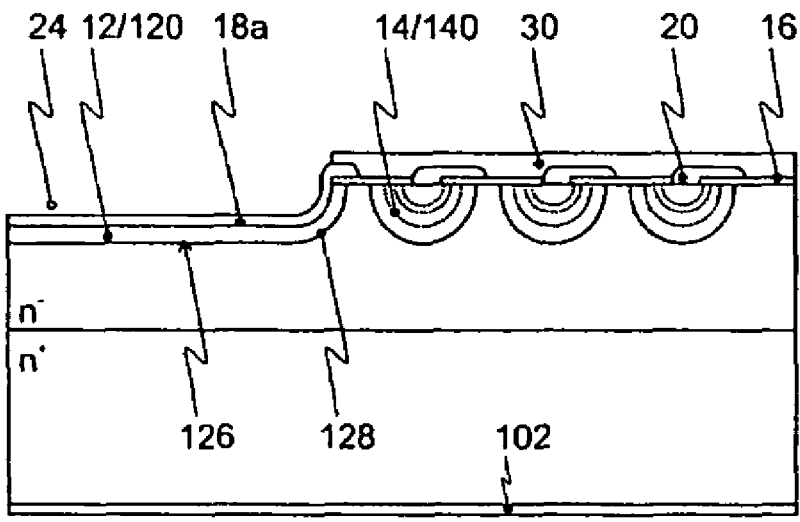
FIG. 7 depicts a power semiconductor component formed in accordance with the second embodiment of the inventive method.

FIG. 7 illustrates a power semiconductor component formed in accordance with the second embodiment of the inventive method. Here second contact region 12 has a doping profile 120 formed by means of ion implantation 28, wherein here as well the curvature 128 of the pn junction 126 is made larger than that afforded by the prior art. The illustration likewise shows field plates 20, a metallization 102 of first surface 100 and a metallization 18a of second contact region 12. Advantageously, a secondary passivation 30 in accordance with the prior art is additionally arranged on the first partial area.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor component comprising:
    a semiconductor base body having a first region with a first doping, a second contact region having a second doping with a first doping profile, said second contact region being formed in said base body and forming a pn junction with said first region;
    wherein said second contact region is disposed at a surface of said base body and extends into said base body, and
    wherein said base body has a trench-type cutout having an edge area and a base area for said second contact region;
    wherein said base area is formed as a second partial area of said second surface, wherein said second contact region extends from said base area via said edge area as far as a first partial area; and
    wherein said pn junction has a curvature adjacent to said edge area.

2. The power semiconductor component of claim 1, wherein a plurality of field rings having a second doping that are likewise arranged in said base body are formed in said edge region and said field rings are disposed at said first partial area of said second surface of said base body and extend into said base body.

3. The power semiconductor component of claim 2, further comprising:
    a passivation of said first partial area;
    a plurality of field plates in conductive contact with a respectively assigned field ring in the region of said field rings disposed to interrupt said passivation.

4. The power semiconductor component of claim 1,
    wherein said edge area is a first edge area, and has a curvature that parallels the curvature of said pn junction.

5. The power semiconductor component of claim 1,
    wherein said edge area has a curvature that parallels a second edge area formed perpendicular to said base area, wherein said second edge area meets said base area in a region in which said pn junction runs parallel to said second surface.

6. Power semiconductor component according to claim 4,
    wherein said second contact region is covered by a contact metallization and said first partial area is covered by a passivation.

7. A method for producing a power semiconductor component
    the semiconductor component comprising:
    a semiconductor base body having a first region with a first doping, a second contact region having a second doping with a first doping profile, the second contact region being formed in the base body and forming a pn junction with the first region;
    wherein the second contact region is disposed at a surface of the base body and extends into the base body, and
    wherein the base body has a trench-type cutout having an edge area and a base area for the second contact region;
    wherein the base area is formed as a second partial area of the surface, wherein the second contact region extends from the base area via the edge area as far as a first partial area; and
    wherein the pn junction has a curvature adjacent to the edge area;
    wherein the method comprises the following steps:
    masking the surface of the semiconductor base body having the first doping;
    producing doping profiles having the second doping proceeding from the surface in a first partial section, which forms the first partial area, and in the second partial section, whereby the field rings and the second contact region are produced;
    forming a trench in the region of the second partial area of the surface for producing the base area and edge area of the second contact region with a depth extent of the trench which amounts to between about 50 percent and about 90 percent of the penetration depth of the second doping and a lateral extent of the trench amounts to at least about ten times the depth extent;
    at least partial passivating of the first partial area; and
    metallizing the second contact region for forming a contact area for an electrically conductive connection.

8. The method of claim 7,
wherein the doping profiles having the second doping are produced simultaneously for the second contact region and the field rings.

9. The method of claim 7,
wherein metallic field plates 20 assigned to the field rings 14 are produced at the same time as the metallization 18 of the second contact region 12 in the region of said field rings.

10. The method of claim 7, further comprising the step of forming a further region, near the surface in the second contact region, having a high concentration of the second doping before metallizing the second contact region.

11. Method for producing a power semiconductor component, the component comprising:
a semiconductor base body having a first region with a first doping, a second contact region having a second doping with a first doping profile, the second contact region being formed in the base body and forming a pn junction with the first region;
wherein the second contact region is disposed at a surface of the base body and extends into the base body, and
wherein the base body has a trench-type cutout having an edge area and a base area for the second contact region;
wherein the base area is formed as a second partial area of the second surface, wherein the second contact region extends from the base area via the edge area as far as a first partial area; and
wherein the pn junction has a curvature adjacent to the edge area
wherein the method comprises the following steps:
masking the surface of the semiconductor base body;
forming a trench in the region of the second partial area of the surface;
producing a doping profile having a second doping by means of ion implantation proceeding from the surface in a first partial section, which forms the later second partial area;
at least partially passivating the first partial area; and
metallizing the second contact region to form thereby a contact area for an electrically conductive connection.

12. The method of claim 11, further comprising the step of forming a further region, near the surface in the second contact region, having a high concentration of the second doping before metallizing the second contact region.

* * * * *